United States Patent [19]
Goldstein et al.

[11] Patent Number: 6,023,354
[45] Date of Patent: Feb. 8, 2000

[54] SEMICONDUCTOR BRAGG REFLECTOR AND A METHOD OF FABRICATING SAID REFLECTOR

[75] Inventors: Léon Goldstein, Chaville; Hans Bissessur, Paris; Alain Bodere, Bruyeres le Chatel; François Brillouet, Clamart; Jean Louis Gentner, Gif sur Yvette; Catherine Graver, Arpajon, all of France

[73] Assignee: Alcatel, Paris, France

[21] Appl. No.: 09/102,655

[22] Filed: Jun. 23, 1998

[30] Foreign Application Priority Data

Jun. 26, 1997 [FR] France .................. 97 08010

[51] Int. Cl.⁷ .................. G02B 5/32; G02B 5/18
[52] U.S. Cl. .................. 359/15; 372/102; 372/96; 372/98; 359/27; 359/569; 359/57; 359/572; 359/576
[58] Field of Search .................. 372/102, 96, 98; 359/15, 27, 569, 571, 572, 576

[56] References Cited

U.S. PATENT DOCUMENTS

| | | | |
|---|---|---|---|
| 4,622,114 | 11/1986 | Glass et al. .................. | 205/655 |
| 5,033,816 | 7/1991 | Blondeau et al. .................. | 359/571 |
| 5,300,190 | 4/1994 | Sugimoto et al. .................. | 216/24 |
| 5,726,805 | 3/1998 | Kaushik et al. .................. | 359/589 |

FOREIGN PATENT DOCUMENTS

0451047A1  10/1991  European Pat. Off. .

OTHER PUBLICATIONS

C. Cremer et al, "Bragg Gratings on INGAASP/INP Waveguides as Polarization Independent Optical Filters" Journal of Lightwave Technology, vol. 7, No. 11, Nov. 1, 1989, pp. 1641–1645.

Primary Examiner—Rodney Bovernick
Assistant Examiner—Sung T. Kim
Attorney, Agent, or Firm—Sughrue, Mion, Zinn, Macpeak & Seas, PLLC

[57] ABSTRACT

A semiconductor Bragg reflector and to a method of fabricating it. The reflector comprises a plurality of stacked layers on a substrate of a III-V type material, one of the stacked layers forming a holographic grating. The layer forming the grating comprises an alternating succession of air pockets and of III-V type material. Such a reflector is particularly suitable for use in laser devices.

4 Claims, 4 Drawing Sheets

SEMICONDUCTOR BRAGG REFLECTOR AND A METHOD OF FABRICATING SAID REFLECTOR

The present invention relates to a semiconductor Bragg reflector and a method of fabricating said reflector.

BACKGROUND OF THE INVENTION

Bragg reflectors are in common use in particular in the field of optical transmission. Such a reflector makes it possible to reflect a portion of the light that it receives.

More particularly, a Bragg reflector is defined by a periodic grating made of two materials having different refractive indices. The reflection ratio of such a device depends both on the difference between the refractive indices of the two component materials, and also on the geometry of the grating. It is proportional to the product κ×L, where L is the length of the grating and κ is the "Bragg coefficient" which is related firstly to the difference between the refractive indices of the two materials, and secondly to the thickness of the grating.

A conventional reflector is shown in longitudinal section in FIG. 1A and in cross-section in FIG. 1B. For example, the reflector may be disposed facing a laser cavity so as to reflect a portion of the light wave emitted by the laser cavity to feed it back to said cavity and enable it to oscillate continuously.

The reflector is implemented on layers 2, 3 stacked by epitaxy on a substrate 1. In general, the substrate 1 is made of indium phosphide (InP) doped with n-type carriers. It may be covered with buffer layer serving to facilitate the epitaxial growth of the various layers to be stacked. The buffer layer is not shown in FIGS. 1A and 1B. The stacked layers perform different optical functions. In the example shown in FIGS. 1A and 1B, an active layer 2 also referred to as a "waveguide" layer is deposited on the substrate 1. The active layer 2 is buried in a "bottom cladding" layer 3 made of a III-V type material such as InP.

The Bragg grating is referenced 10 in FIG. 1A. It includes a material 4 based on InP, such as, for example, a quaternary material of the GaInAsP type, shown by hatching in FIGS. 1A and 1B, and an InP material 5 constituting a "top cladding" layer.

The grating is formed by growing a layer 4 of the quaternary material by epitaxy on the bottom cladding layer, by etching the layer 4 in a crenelated configuration, and then by filling in the resulting gaps with a top cladding layer of InP 5 doped with p-type carriers. Since the GaInAsP quaternary material 4 and the InP 5 have different refractive indices equal respectively to 3.3 and to 3, the resulting holographic grating 10 makes it possible to reflect part of the light wave that it receives.

For example, when a transmitter using wavelength division multiplexing (WDM) is to be implemented, the length L of the Bragg grating must be as short as possible to avoid too much reflection. The longer the grating, the higher the reflection. The mean reflection ratio of a Bragg grating should not exceed 30%.

In addition, a grating having a large refractive index step size offers the advantage of being usable for a large number of wavelengths because it enables reflection to be obtained over a wide spectrum window.

OBJECT AND BRIEF SUMMARY OF THE INVENTION

An object of the invention thus consists in providing a semiconductor Bragg reflector having a large refractive index step size and a high reflection ratio (about 30%) over a short length L, typically less than or equal to 10 μm. For this purpose, the Bragg grating must have a coefficient κ that is very high. Since the coefficient κ is related to the index step size and to the thickness of the grating, the grating must therefore have a very large index step size and/or be very thick.

Several solutions have already been considered in the prior art for implementing a semiconductor Bragg grating having a large index step size, and a high reflection ratio over a short length.

A first solution consists in increasing the size of the index step between the two component materials of the grating. For this purpose, the layer 4 of quaternary material is replaced with another material based on indium and/or on phosphorus and having a higher refractive index. Unfortunately, since both of the materials used to make the grating are based on indium and/or on phosphorus, the refractive indices differ only very slightly. In general, they lie in the range 3 to 3.4. The size of the index step is therefore very limited. In general, it is about 0.4 and it cannot in any case exceed 1.

Another, more common solution consists in increasing the thickness of the grating so that the light wave perceives a contrast that is as large as possible. The contrast is related both to the type of the material and to the thickness of the grating, i.e. the thickness of the layer of quaternary material. Unfortunately, that solution does not make it possible to implement a reflector offering the desired performance. If the gaps formed in the quaternary material are too deep, the filling-in step is difficult to perform without degrading the crystal quality of the filling-in material, i.e. of the top cladding layer. When the crystal quality of the top cladding layer is affected, light propagation losses appear, and therefore the performance of the device is reduced, and the Bragg coefficient κ does not increase sufficiently to obtain a high reflection ratio.

A third solution that has already been studied consists in cutting a trench through the sample at the inlet of the reflector. The trench is formed such that it passes through the layers forming the grating. In that case, the length of the trench must be controlled exactly to enable part of the light to be reflected, thereby creating constructive interference. The geometrical constraints on the trench are thus very stringent and very difficult to satisfy with current technology. As a result, that solution cannot be considered favorably.

The present invention makes it possible to mitigate the above-mentioned drawbacks because it proposes a simple method of fabricating a Bragg reflector of short length and of very large index step size.

The invention firstly provides a method of fabricating a semiconductor Bragg reflector on stacked layers deposited successively by epitaxy on a substrate of a material of the III-V type, said method consisting in:

a—depositing a stop layer of a quaternary material on one of said stacked layers;

b—depositing a bottom cladding layer on said stop layer;

c—depositing a layer of a ternary material on said bottom cladding layer;

d—etching the layer of ternary material locally and selectively to a determined crenelated configuration;

e—depositing a top cladding layer so as to fill in the resulting gaps and so as to create a first holographic grating;

f—laterally etching the top cladding layer, the layer of ternary material and the bottom cladding layer until the stop layer is reached, so as to form a ridge; and g—etching the first holographic grating by wet etching so as to remove selectively said ternary material, thereby forming another grating structure having a large refractive index step size.

Preferably, the material constituting the substrate, the bottom cladding layer, and the top cladding layer is InP.

The invention further provides a semiconductor Bragg reflector comprising a plurality of stacked layers on a substrate of a III-V type material, one of said stacked layers forming a holographic grating, wherein said layer forming the grating comprises an alternating succession of air pockets and of III-V type material.

Preferably, the layer forming the grating is in the form of a ridge of width lying in the range 2.5 µm to 3.5 µm and of length not more than 10 µm.

The method of the invention thus makes it possible to implement a Bragg grating that has a refractive index step of very large size. Since InP has a refractive index equal to 3, and air has a refractive index equal to 1, the size of the index step of the reflector is equal to 2. This size is considerably greater than the size of the refractive index step between two materials based on InP. This increase in the index step size leads to an increase in the Bragg coefficient by a factor of 10. The reflector of the invention has a reflection ratio that is high, i.e. about 30%.

Various depths are possible for the etched ridge in the reflector of the invention, and the reflector may include one or more other layers for performing other optical functions. However, the use of the reflector depends on the depth of etching of the ridge, i.e. on whether the ridge includes some other optical function, such as a waveguide function, for example. In one case, the reflector is used in laser devices, while in another case, it is used in modulators or in waveguides.

BRIEF DESCRIPTION OF THE DRAWINGS

Other features and advantages of the invention appear on reading the following description given by way of non-limiting example and with reference to the accompanying figures, in which:

FIGS. 2A to 2C are longitudinal-section views of a reflector of the invention while it is being fabricated, FIG. 2D is a cross-section view, and FIG. 2E is a perspective view of the fully finished device.

MORE DETAILED DESCRIPTION

Figure 1A:
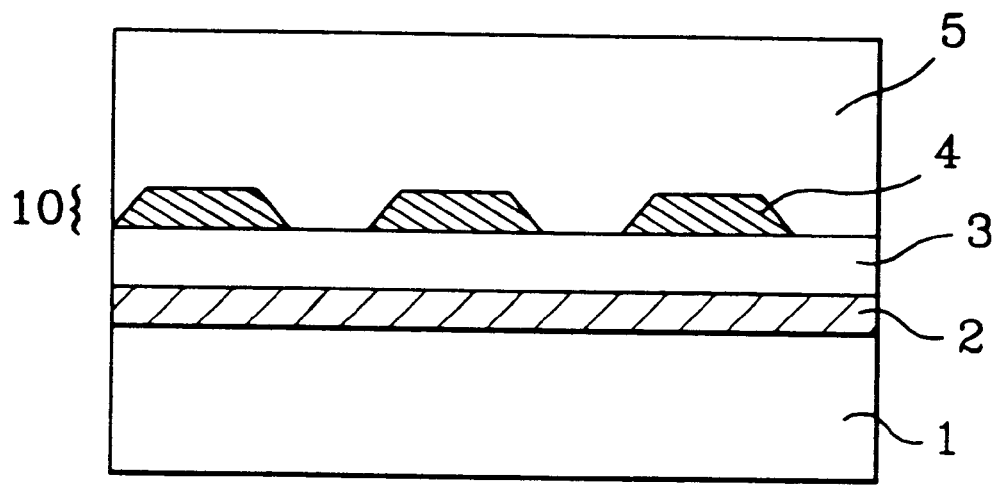
FIGS. 1A and 1B, described above, are views showing a conventional Bragg reflector respectively in longitudinal section and in cross-section.
Figure 1B:
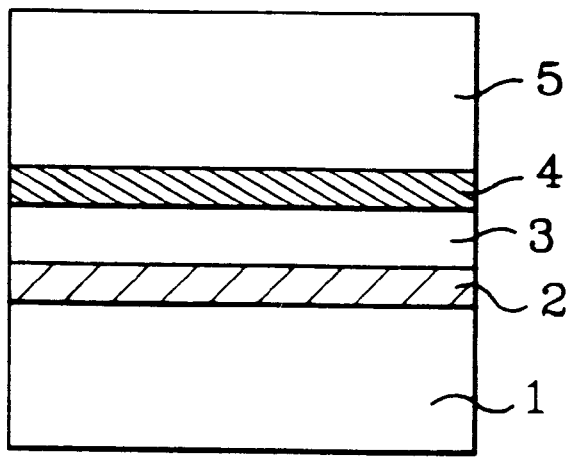
Figure 2A:
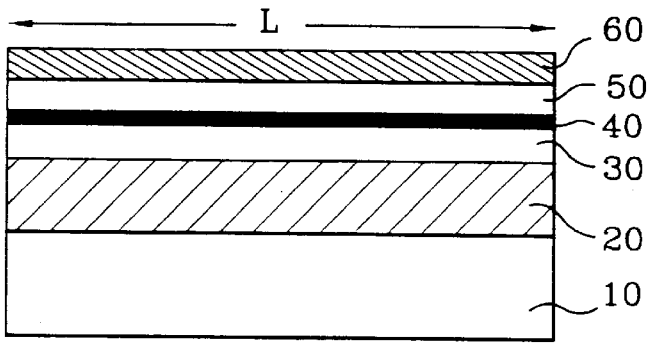
FIGS. 2A to 2E are various views of a Bragg reflector of the invention during the various steps involved in fabricating it.

A first stage of the method consists in forming a vertical structure as shown in FIG. 2A. For this purpose, a plurality of successive layers 20, 30, 40, 50, 60 are grown epitaxially on a substrate 10 made of a III-V type material, such as InP, for example. Preferably, the substrate is made of InP that is doped with carriers of a first type, e.g. n-type carriers. Naturally, the substrate 10 may be covered with a buffer layer serving to facilitate growing of the various layers to be stacked. The buffer layer is not shown in FIG. 2A.

In the example shown in FIG. 2A, the layer 20 covering the substrate 10 constitutes a waveguide layer, also referred to as an "active layer". It is preferably made up of an alternating succession of layers of InP and of layers of a quaternary material. In one embodiment, it comprises 20 layers of InP of thickness equal to 100 Å (1 Å=$10^{-10}$ meters) in alternation with 20 layers of quaternary material of thickness equal to 100 Å.

Layer 30 is made of indium phosphide (InP), for example, and it enables the active layer to be buried. It is deposited over a thickness of about 300 Å.

Layer 40 constitutes a stop layer. It is preferably made of a quaternary material, e.g. of the GaInAsP type, over a thickness of about 50 Å. Its purpose is described below with reference to FIG. 2D.

Layer 50 constitutes a bottom cladding layer. It is preferably made of InP over a thickness of about 450 Å.

Finally, layer 60 is used to form the holographic grating of the reflector. It is preferably made of a ternary material, e.g. of the GaInAs type, and its thickness is 1000 Å.

This vertical structure is formed over a length not more than 10 µm. This length is very short compared with the length of a laser cavity which is generally about 600 µm long.

Figure 2B:
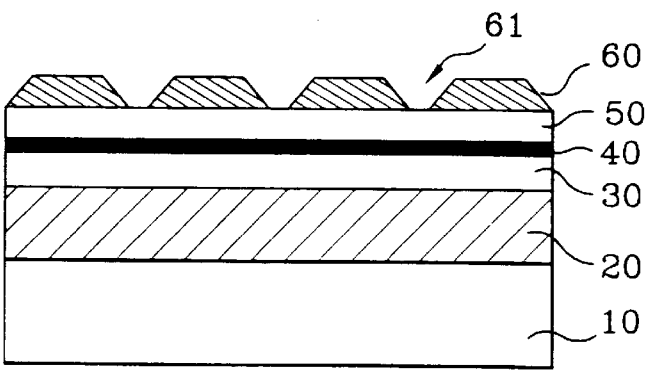

Once the vertical structure has been formed, a subsequent step of the fabrication method consists in forming the holographic grating. For this purpose, firstly the layer 60 of ternary material is locally and selectively etched to a determined grating configuration (FIG. 2B). Gaps 61 are thus formed in the ternary material, exposing the bottom cladding layer 50. For example, the etching may be performed by wet etching, by means of a solution maintained at 0° C. and comprising sulfuric acid, hydrogen peroxide, and water in the following respective proportions: 10:1:1. The etching time is very short since it must not exceed 3 seconds. Prior to etching, a conventional resin serving as a mask for the etching step is deposited on the surface of the layer of ternary material 60. In a variant embodiment, it is quite possible to consider using a conventional dry etching method.

The gaps 61 formed in the layer 60 of ternary material are then filled in by causing a top cladding layer 70 to grow. The top cladding layer is preferably made of the same material as the bottom cladding layer 50, i.e. of InP. Furthermore, it is doped with carriers of a second type, i.e. p-type carriers in the example shown in FIGS. 2A to 2E. Since the thickness of the layer of ternary material 60 is about 100 nm, it is thin enough to avoid problems of degrading the crystal quality of the filling-in material 70.

Figure 2C:
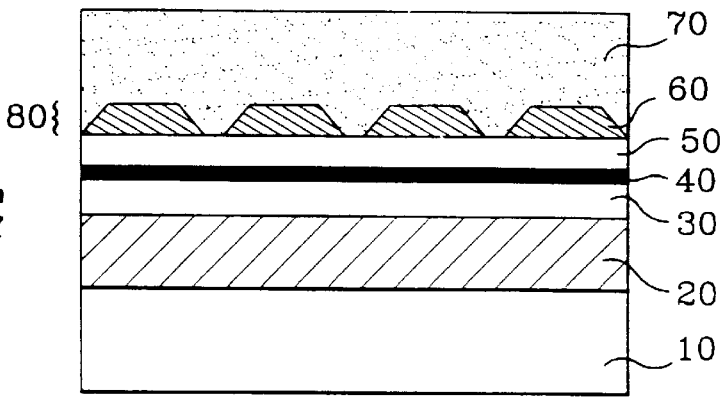

Filling in the gaps 61 with the top cladding layer 70, as shown in FIG. 2C, makes it possible to form a buried layer 80 having a holographic grating structure. This layer 80 is made up of two materials having different refractive indices. It is made up of the ternary material GaInAs 60 that has not been removed by etching, and of the InP III-V material constituting the top cladding layer 70.

Figure 2D:
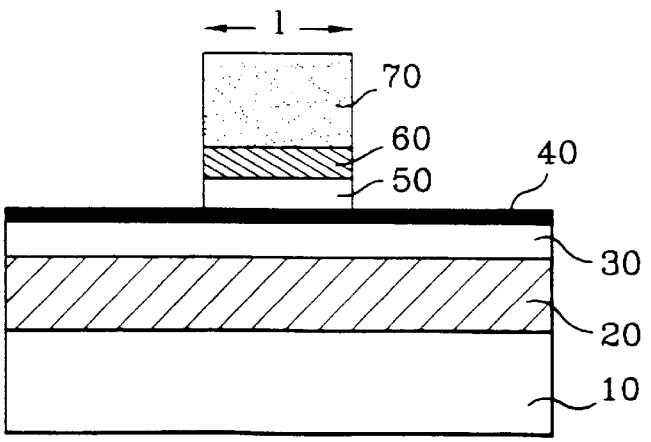

The resulting grating structure 80 is then etched laterally to form a ridge as shown in FIG. 2D. For this purpose, the top cladding layer 70, the layer of ternary material 60, and the bottom cladding layer 50 are etched laterally, until the stop layer 40 is reached. The ridge is preferably formed by means of a conventional dry etching method, such as reactive ion etching (RIE), for example, that does not or that finds it very difficult to etch into the stop layer 40 of quaternary material. Thus, etching the ridge stops at the stop layer 40. The ridge preferably has a width 1 lying in the range 2.5 µm to 3.5 µm.

Finally, the last step in the fabrication method of the invention is essential to obtain a Bragg grating that has a very large index step size. It consists in etching the holographic grating structure 80 made of InP and InGaAs to remove selectively the InGaAs ternary material 60. Air pockets, referenced 62 in FIG. 2E, are thus formed periodically in place of the ternary material.

Figure 2E:
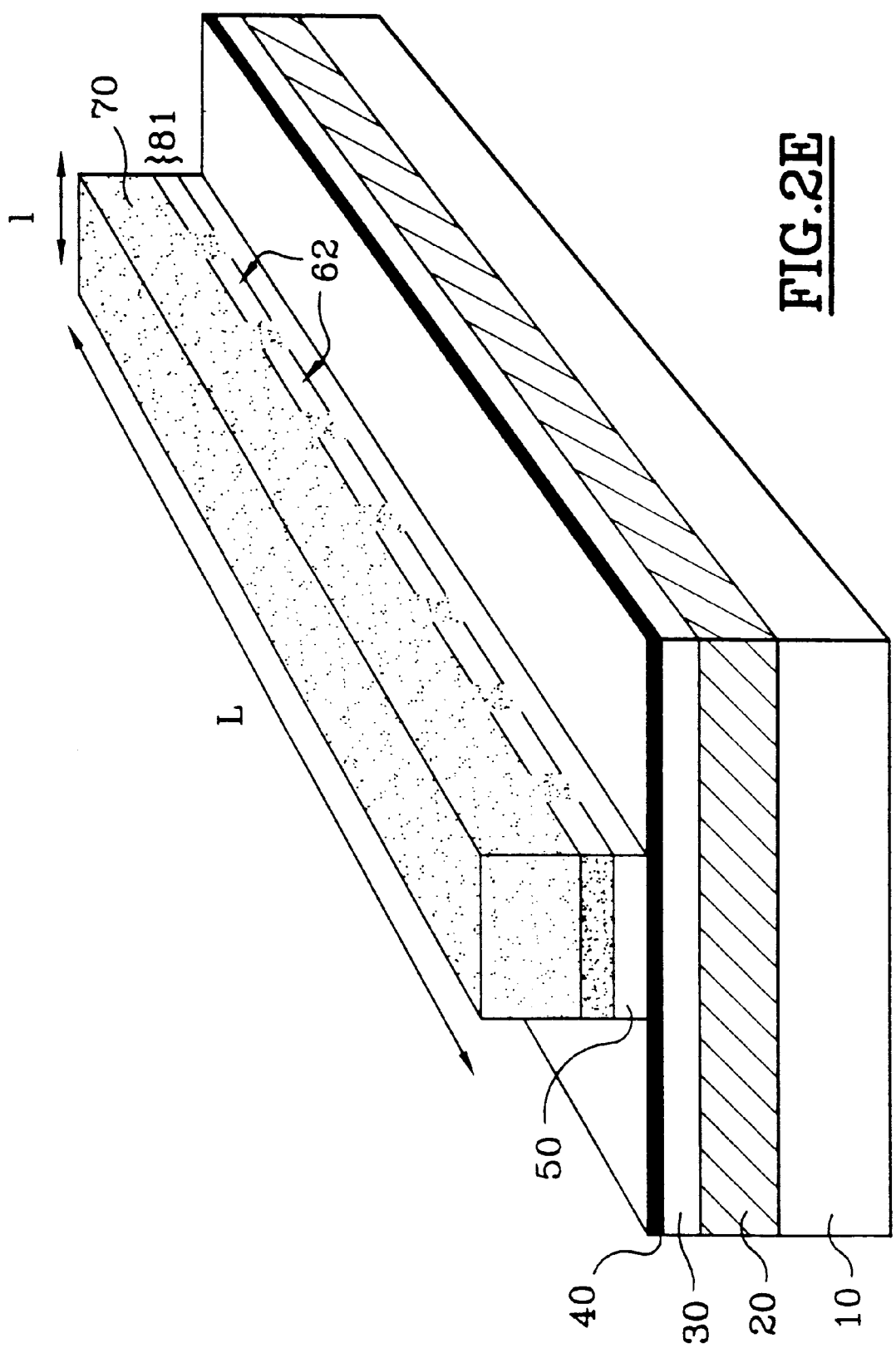

This selective etching makes it possible to replace the first grating structure 80 with a second grating structure, referenced 81 in FIG. 2E, made up of air pockets 62 and of InP 70, and having a very large index step size that is considerably larger than the index step size of an InP/InGaAs grating. While an InP/InGaAs holographic grating has an index step size of about 0.3, the holographic grating 81 of the reflector of the invention has an index step size equal to 2 because it is made up of InP whose refractive index is equal to 3 and of air whose refractive index is equal to 1. This large index step size further makes it possible to increase the Bragg coefficient κ by a factor of 10.

Advantageously, the selective etching of the grating is performed by wet etching by means of a solution suitable firstly for etching rapidly the GaInAs ternary material in order to form air pockets in the grating structure, and secondly for etching very slowly the GaInAsP quaternary material forming the stop layer 40 and the InP forming the bottom cladding layer 50 and the top cladding layer 70.

The solution is maintained at 0° C. and it preferably comprises sulfuric acid, hydrogen peroxide, and water, in the following respective proportions: 1:3:10. The etching is performed for a duration lying in the range 40 seconds to 50 seconds, and preferably for a duration equal to 45 seconds. With such a solution, the ternary material is etched about ten times as rapidly as the quaternary material or as the InP.

The InP/air pocket holographic grating 81 is formed over a thickness corresponding to the thickness of the layer 60 of ternary material, i.e. over a thickness of about 100 nm.

The pitch of the grating is determined as a function of the wavelength of the light wave to be reflected. Thus, when the Bragg reflector is used in a laser device, for example, the pitch of the grating is such that the wavelength of the wave reflected towards the laser cavity lies in the vicinity of 1.55 µm. In which case, the pitch of the grating therefore lies in the range 237 nm to 240 nm.

The resulting Bragg reflector makes it possible to obtain a reflection ratio of 30%. In addition, as a result of the large index step size, the reflection is broadband, i.e. the 30% reflection is obtained over a wide spectrum window. The width of the spectrum window lies in the range 25 nm to 30 nm. As a result, the Bragg reflector further offers the advantage of being usable for a large number of wavelengths.

The above-described reflector has a ridge that is shallow because only the holographic grating is etched in the form of a ridge. Such a shallow-ridge reflector is used particularly in laser devices to feed light energy back into the laser cavity, and to make it oscillate continuously.

Figure 3:
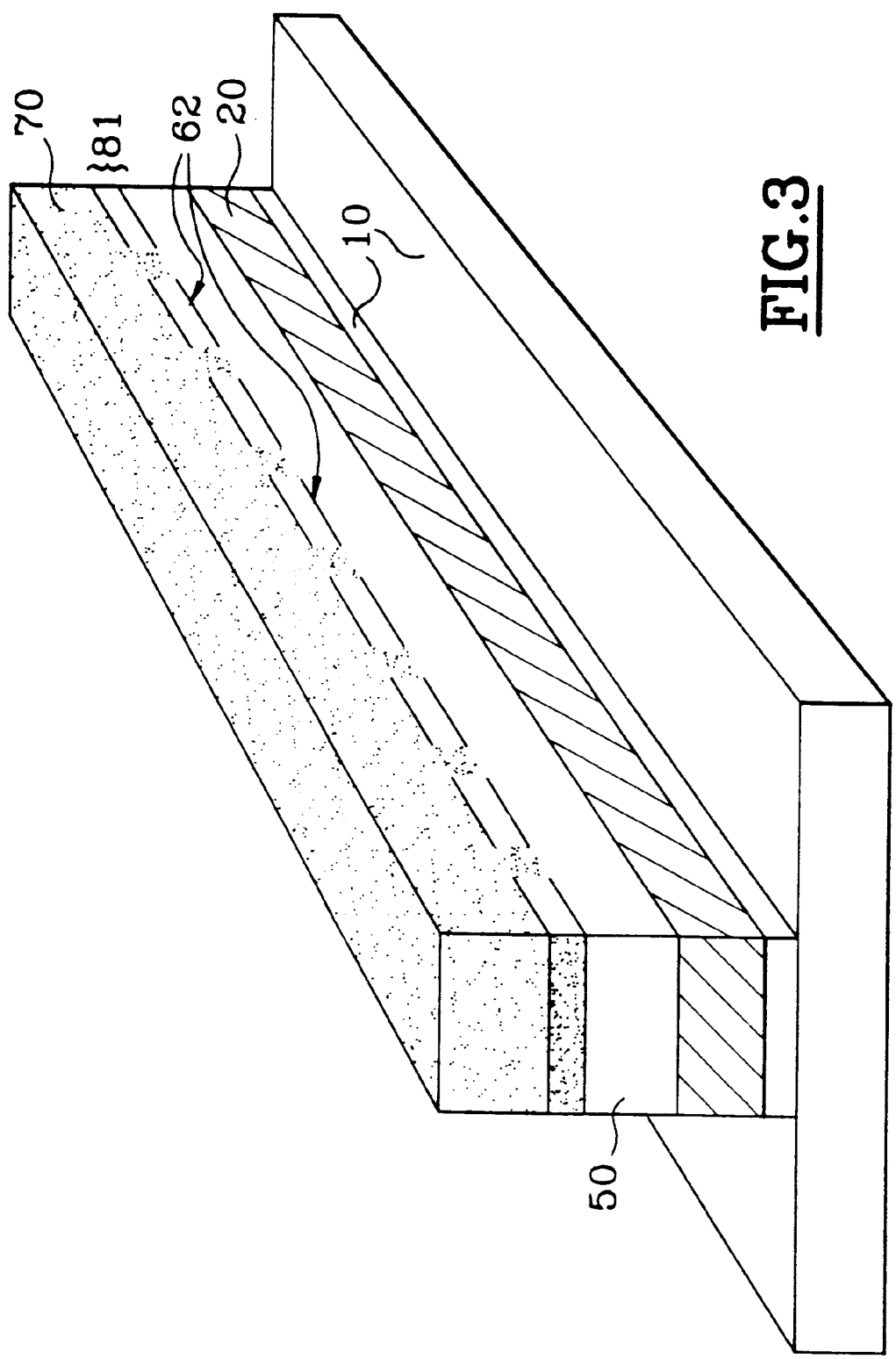
FIG. 3 is a perspective view of a variant embodiment of a Bragg reflector.

A variant embodiment of a Bragg reflector is shown in perspective in FIG. 3. In this variant, only the geometrical shape of the ridge is changed. The lateral etching is extended so that the active layer 20 is also in the form of a ridge. The ridge may be etched in a single step by means of a dry etching method, e.g. by reactive ion etching.

In this case, since the active layer is no longer protected by the layer 30 of InP, it is even more important for the etching step in which the InP/GaInAs first holographic grating is etched, for the purposes of removing the GaInAs and replacing it with air pockets, to be very selective and not to etch, or to etch only slowly, the InP and the GaInAsP quaternary material making up the active layer 20, so that said active layer is not damaged.

The resulting ridge is then very deep. This deep-ridge type of reflector cannot be used in laser devices. However, it can be used in modulators or in waveguides.

What is claimed is:

1. A semiconductor Bragg reflector comprising a plurality of stacked layers on a substrate of a III-V type material, one of said stacked layers forming a holographic grating, wherein said layer forming the grating comprises an alternating succession of air pockets and of III-V type material.

2. A Bragg reflector according to claim 1, wherein the III-V type material is InP.

3. A Bragg reflector according to claim 1, wherein the layer forming the holographic grating has a thickness of about 100 nm.

4. A Bragg reflector according to claim 1, wherein the layer forming the grating is in the form of a ridge of width lying in the range 2.5 µm to 3.5 µm and of length not more than 10 µm.

* * * * *